(12) United States Patent
Niebojewski et al.

(10) Patent No.: US 12,740,105 B2
(45) Date of Patent: Sep. 15, 2026

(54) FABRICATING OF A QUANTUM DEVICE WITH AUTOALIGNMENT OF THE GATES ON THEIR RESPECTIVE ACTIVE ZONE REGION

(71) Applicant: COMMISSARIAT A L'ENERGIE ATOMIQUE ET AUX ENERGIES ALTERNATIVES, Paris (FR)

(72) Inventors: Heimanu Niebojewski, Grenoble Cedex (FR); Benoît Bertrand, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 704 days.

(21) Appl. No.: 18/059,081

(22) Filed: Nov. 28, 2022

(65) Prior Publication Data

US 2023/0170402 A1 Jun. 1, 2023

(30) Foreign Application Priority Data

Nov. 29, 2021 (FR) ...................................... 2112630

(51) Int. Cl.
*H10D 48/00* (2025.01)
*H10D 64/01* (2025.01)
(Continued)

(52) U.S. Cl.
CPC ........... *H10D 48/383* (2025.01); *H10D 64/01* (2025.01); *H10P 50/268* (2026.01);
(Continued)

(58) Field of Classification Search
CPC .... H10D 48/383; H10D 64/01; H10D 30/014; H10D 30/43; H10D 48/3835;
(Continued)

(56) References Cited

U.S. PATENT DOCUMENTS

| | | | |
|---|---|---|---|
| 9,773,208 | B2 | 9/2017 | Betz et al. |
| 2006/0138552 | A1 | 6/2006 | Brask et al. |

(Continued)

OTHER PUBLICATIONS

Wang et al., Germanium Quantum-Dot Array with Self-Aligned Electrodes for Quantum Electronic Devices, Oct. 16, 2021, Nanomaterials, vol. 11, pp. 1-15. (Year: 2021).*
Ansaloni, F., Chatterjee, A., Bohuslavskyi, H. et al. Single-electron operations in a foundry-fabricated array of quantum dots. Nat Commun 11, 6399 (2020). (Year: 2020).*

(Continued)

*Primary Examiner* — Christine S. Kim
*Assistant Examiner* — Nathalie R Fayette
(74) *Attorney, Agent, or Firm* — Oblon, McClelland, Maier & Neustadt, L.L.P.

(57) ABSTRACT

A method for fabricating a quantum device includes, in order, forming, on a semiconductor active zone resting on a substrate, a stack having at least one layer of gate material and one or more masking layers on the layer of gate material; forming, facing the active zone, a separation trench by etching through the one or more masking layers, the trench having a bottom revealing the at least one layer of gate material; forming, in the one or more masking layers, one or more pairs of masking blocks, each pair including a second masking block facing a first masking block, the first and second masking blocks being disposed on either side of the trench; and forming, in line with each masking block and by etching the at least one layer of gate material, a gate block so as to form one or more pairs of gate blocks.

18 Claims, 9 Drawing Sheets

(51) Int. Cl.
*H10P 50/00* (2026.01)
*H10P 50/26* (2026.01)
*H10P 50/28* (2026.01)
*H10P 76/20* (2026.01)

(52) U.S. Cl.
CPC ............ *H10P 50/283* (2026.01); *H10P 50/71* (2026.01); *H10P 50/73* (2026.01); *H10P 76/2043* (2026.01)

(58) Field of Classification Search
CPC .................. H10D 64/27; H10D 62/121; H01L 21/0276; H01L 21/31116; H01L 21/31144; H01L 21/32137; H01L 21/32139; B82Y 10/00; G06N 10/40; H10P 50/268; H10P 50/283; H10P 50/71; H10P 50/73; H10P 76/2043
USPC .......................................................... 257/314
See application file for complete search history.

(56) References Cited

U.S. PATENT DOCUMENTS

| | | | | |
|---|---|---|---|---|
| 2019/0371926 | A1 | 12/2019 | Hutin et al. | |
| 2020/0144400 | A1 | 5/2020 | George et al. | |
| 2020/0312989 | A1* | 10/2020 | George ................ | H10D 30/014 |
| 2021/0343570 | A1* | 11/2021 | Or-Bach et al. ....... | H10D 88/00 |

OTHER PUBLICATIONS

French Preliminary Search Report Issued Jul. 15, 2022 in French Application 21 12630 filed on Nov. 29, 2021 (with English Translation of Categories of Cited Documents), , 2 pages.
De Franceschi, S. et al., "SOI Technology for Quantum Information Processing", arxiv.org, DOI: 10.1109/IEDM.2016.7838409, arXiv:1912.08313v1, 2019, 4 pages.
Kanne, T. et al., "Double Nanowires for Hybrid Quantum Devices", arxiv.org, arXiv:2103.13938v1, 2021, 22 pages.

* cited by examiner

PRIOR ART

FABRICATING OF A QUANTUM DEVICE WITH AUTOALIGNMENT OF THE GATES ON THEIR RESPECTIVE ACTIVE ZONE REGION

TECHNICAL FIELD

The present application relates to the field of quantum electronic devices and in particular that of fabricating a quantum device with quantum bits (also called "qubits") formed by semiconductor islands and using one or more pairs of gate electrodes located on top of the islands.

It relates more particularly to an improved method for producing a quantum device making it possible in particular to obtain an autoalignment of the gate electrodes with respect to the islands.

PRIOR ART

Quantum islands (sometimes also called quantum boxes or dots) form basic elements of a quantum electronic device. Quantum islands are typically formed in a layer of semiconductor material in which potential wells are used for confining carriers, electrons or holes, in three dimensions in space. Quantum information can then be encoded by means of the spin of the carrier. Then spin qubits are spoken of.

According to one approach, electrons are confined by field effect under the effect of gate electrodes similar to those used in transistor structures, and the information is encoded in the spin of these electrons. These so-called "front" gates are disposed on top of all the quantum islands.

Among the various types of quantum device structure existing, a known structure illustrated in FIG. 20 includes: a first semiconductor bar (normally called "end") 341 and a second semiconductor bar 342, both juxtaposed, and pairs of front control gates 361, 362, each pair being formed respectively by a first front control gate 361 covering a portion of the first semiconductor bar 341 and a second front control gate 362 covering a portion of the second semiconductor bar 342. In this way two active zone parts are used in parallel, the first formed by the first bar 341 being intended to form quantum boxes and the second part formed by the second bar 342 being intended to form charge detectors.

The charge detector facing each quantum box makes it possible to measure the number of charges trapped in this quantum box. The detection principle is based on a capacitive coupling between the quantum box and the charge detector facing this box. It is preferably sought to maximise this capacitive coupling in order to improve the efficacy of the detector, which involves reducing the distance between detector and quantum box as far as possible, here corresponding to the distance A between the bars 341, 342.

A good alignment of the gates on such restricted spaces is difficult to obtain. Moreover, any coiling of the gates around the bars 341, 342 may lead to a strong screening effect.

Furthermore, with such an arrangement, a distance A between the bars 341, 342 is greater than the minimum space Smin achievable between gates 361, 362 in order to ensure the correct overlap of the bars by the gates. This limits the performances in terms of electrostatic coupling between bars 341, 342.

The problem is posed of finding a novel method for fabricating a quantum device.

DESCRIPTION OF THE INVENTION

According to one aspect, the present invention relates to a method for fabricating a quantum device including, in this order, steps including:

a) forming, on a semiconductor zone referred to as an "active zone" resting on a substrate: a stack comprising at least one layer of gate material and one or more masking layers on this layer of gate material, b) forming, facing the active zone: a separation trench by etching through said one or more masking layers, said trench having a bottom revealing said at least one layer of gate material, c) forming, in said one or more masking layers of said stack: one or more pairs of masking blocks, each pair of masking blocks including a first masking block and a second masking block facing the first masking block, the first masking block and the second masking block being disposed facing each other and on either side of said trench, d) forming, in line with each masking block and by etching said at least one layer of gate material: a gate block, so as to form one or more pairs of gate blocks.

Thus, in the method defined above, rather than forming a set of gate patterns that are next cut and separated into pairs of gate blocks located facing each other, pairs of gate blocks, the positioning of which is precise with respect to the active zone, are formed directly by means of the previously produced trench.

According to another aspect, the present invention relates to a method for fabricating a quantum device comprising steps of:

forming, on a semiconductor zone referred to as an "active zone" resting on a substrate: a stack comprising at least one layer of gate material and one or more masking layers on this layer of gate material, then forming, facing the active zone: a separation trench by etching through said one or more masking layers, removing, at the bottom of said trench, one or more surface portions of said at least one layer of gate material in line with said trench, forming, in said one or more masking layers of said stack: one or more pairs of masking blocks, each pair of masking blocks including a first masking block and a second masking block facing the first masking block, the first masking block and the second masking block being disposed facing each other and on either side of said trench, then etching said layer of gate material so as to form a gate block in line with each masking block and removing, at the bottom of said trench, at least a part of said active zone located in line with said one or more removed surface portions of said at least one layer of gate material.

With such a method, the etching of the layer of gate material that is extended in the active zone is made mutual, and an autoalignment of the gate blocks is implemented with respect to the remaining regions of the active zone, while limiting the number of steps necessary for this.

According to a first possibility of implementation of the fabricating method, the separation trench is formed by etching extended so as to implement said removal of a surface portion of said at least one layer of gate material.

Advantageously, the removal at the bottom of the trench of said at least a part of said active zone is implemented so as to divide the active zone into a first semiconductor region and a second semiconductor region entirely separate from the first semiconductor region.

According to one possibility of implementation, the trench formed can extend beyond the active zone.

According to a possible implementation of the method, after said removal at the bottom of said trench of said one or more surface portions, the formation of the masking blocks may comprise steps of:

- forming one or more masking elements transverse with respect to said trench, said transverse masking elements covering said trench, said masking elements being formed by depositing and structuring at least one hard mask layer, said hard mask layer being preserved in said trench,
- anisotropic etching of zones of said one or more masking layers not protected by the transverse masking elements,
- removing said masking elements.

According to a second possibility of implementation of the fabricating method, the trench may be produced by etching said one or more masking layers while stopping on the gate material layer, the method furthermore comprising, after producing the trench, the formation of one or more masking elements traversing said trench, said masking elements being transverse with respect to said trench and being separate from each other, the removal of said surface portions of said at least one layer of gate material in line with said trench and the formation of said one or more pairs of masking blocks being implemented by anisotropic etching of zones not protected by the masking elements, the method furthermore comprising, prior to said etching of said layer of gate material so as to form a gate block: the removal of the masking elements.

In this case, advantageously, the trench may extend entirely facing the active zone.

According to one possibility of implementation, the anisotropic etching of said zones not protected by the transverse masking elements can be extended so as to divide the active zone into a first semiconductor region and a second semiconductor region, the first semiconductor region and the second semiconductor region being connected together by semiconductor portions.

Advantageously, after the step of forming the pairs of gate blocks, the method may furthermore comprise: the formation of insulating spacers around said gate block, a region of the spacers extending in the trench.

Advantageously, the method may furthermore comprise, after the step of forming the pairs of gate blocks: a step of growing doped semiconductor material on regions of the active zone disposed on either side of the gate blocks, so as to form reservoirs of dopants.

After the formation of the reservoirs of dopants, the method may comprise the siliciding of a top face of said reservoirs of dopants and of the gate blocks.

Advantageously, the active zone may be formed by a pattern in a surface layer of a substrate of the semiconductor on insulator type provided with a semiconductor support layer and with an insulating layer, said insulating layer being arranged between the support layer and said surface layer.

BRIEF DESCRIPTION OF THE DRAWINGS

The present invention will be understood best from the reading of the description of example embodiments given, purely for indication and in no way limitatively, with reference to the accompanying drawings, on which:

FIG. 3A is a view in cross section along a cutting plane passing through the axis A in

FIG. 2.

FIG. 16 is a perspective view illustrating etching of the masking layers.

FIG. 17 is a perspective view illustrating forming gate blocks.

Identical, similar or equivalent parts of the various figures bear the same numerical references so as to facilitate passing from one figure to another.

The various parts shown in the figures are not necessarily shown to a uniform scale, to make the figures more legible.

Furthermore, in the following description, terms that depend on the orientation of the structure apply on the understanding that the structure is oriented as illustrated on the figures.

DETAILED DESCRIPTION OF PARTICULAR EMBODIMENTS

Figure 1:
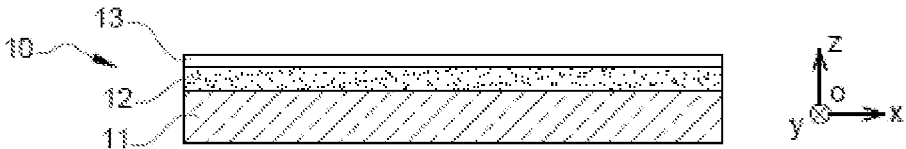
FIG. 1 shows a starting material for producing a quantum device according to a first embodiment of the invention.

Reference is made first of all to FIG. 1, which shows a possible starting material for producing a quantum device, in particular spin qubits, and which is in the form of a substrate 10 of the semiconductor on insulator type.

The substrate thus includes a support layer 11 made from semiconductor material, a buried insulating layer 12 disposed on the support layer 11 and a semiconductor surface layer 13 disposed on the insulating layer 12.

The substrate is typically an SOI substrate the surface layer 13 of which can be made from silicon, in particular $^{28}Si$ when this layer is made to accommodate electron spin qubits. The insulating layer 12 and the support layer 11 are typically, respectively, a layer of silicon oxide commonly referred to as "BOX" (standing for "buried oxide") and a layer based on silicon. The thickness of the surface layer 13 is for example between approximately 5 nm and 50 nm, typically of the order of 10 nm. The thickness of the buried insulating layer 12 is for example between 15 nm and 150 nm. The thickness of the support layer 11 (the thicknesses being dimensions measured along the z axis of the orthogonal reference frame [O; x; y; z] given in FIG. 1) for its part may for example be of the order of 775 μm in the case where a wafer of the 300 mm type is used.

Figure 2:
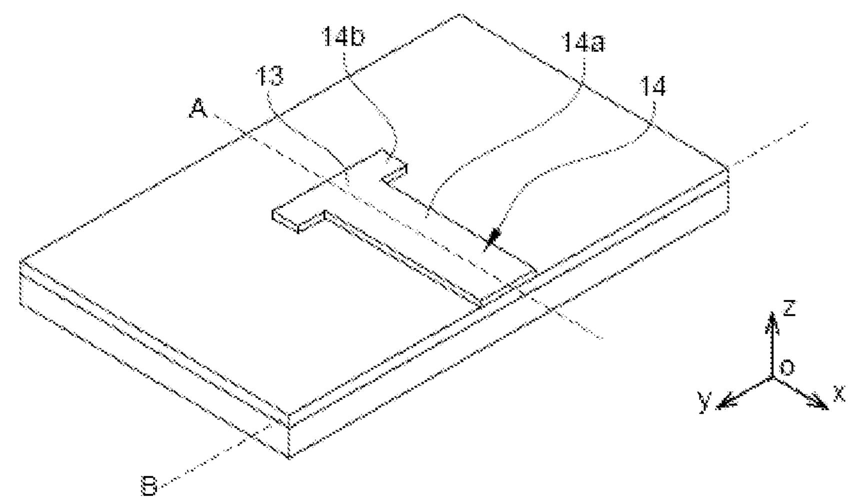
FIG. 2 illustrates forming an active pattern zone on a surface layer.

Other semiconductor materials can be envisaged for the surface semiconductor layer 13. In particular, when this surface layer 13 has to accommodate hole spin qubits, the surface layer may be formed from $Si_{1-x}Ge_x$ with x preferably varying between 0% and 70%. Next, at least one active-zone pattern 14 can be defined in the surface layer 13. The active zone 14 can be formed by a slender central portion 14*a* including, at its ends, portions 14*b* with a greater width (only one end portion 14*a* being shown on the partial perspective view of FIG. 2), but other forms can be envisaged. This definition of the active zone 14 can be produced by photolithography and etching of the surface layer 13, in particular a plasma etching with stop on the insulating layer 12.

Then a gate stack covering the active zone 14 is produced. This stack is typically formed by a gate dielectric layer 19 and at least one layer of semiconductor gate material or materials such as doped and/or metallic polysilicon such as TiN, Al or W. The gate dielectric 19 may be an oxide, in particular a silicon oxide obtained by deposition or by oxidation of a surface thickness of the active zone 14. For example, the thickness of the gate dielectric layer 19 may be of the order of 5 nm. In this case, according to a particular example embodiment, the gate stack may for its part be formed by a metal layer 20*a* of TiN with a thickness for example of the order of 6 nm coated with a layer 20*b* of polysilicon for example of the order of 30 nm (the layer 20*a* being shown on FIG. 3A, but not on the following figures in order to make reading easier).

The gate stack may be coated (FIGS. 3A, 3B giving respectively a view in cross section along a cutting plane passing through the axis A and orthogonal to the axis B given on FIG. 2 and a perspective view) of at least one masking layer, in particular of one or more hard mask layers 21*b*, 21*c* formed typically by insulating layers, for example made from SiN and/or $SiO_2$.

Figure 3A:
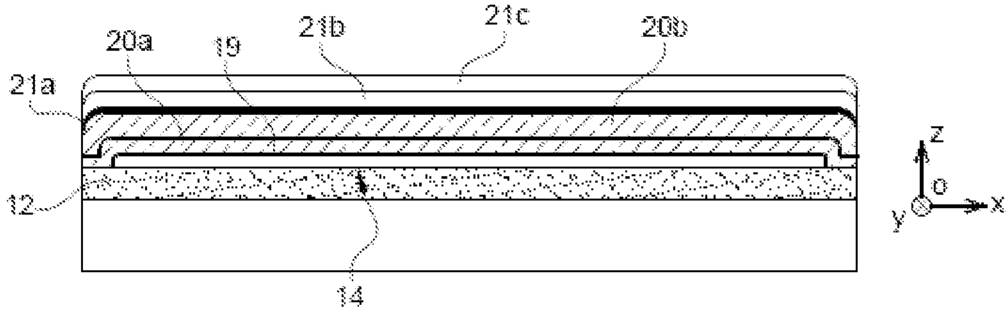
Figure 3B:
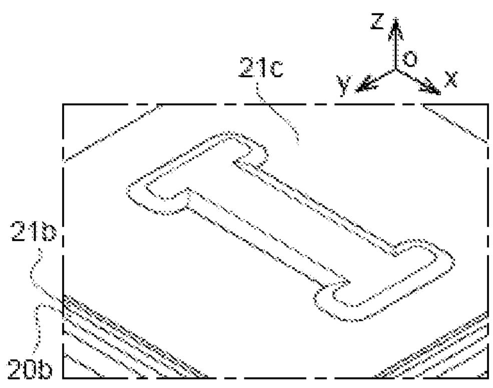
FIG. 3B is a perspective view of the masking layers.

In the example embodiment illustrated on FIG. 3A, a stack is produced for forming this masking, with a layer 21*b*, for example made from SiN and with a thickness of between for example 20 nm and 30 nm coated with a layer 21*c* for example based on silicon oxide with a thickness for example of between 20 nm and 30 nm. Optionally, a layer 21*a* of oxide may be provided on the layer 21*b* of nitride (such a layer not being shown on the following figures).

Next a trench 33 is formed through said one or more masking layers 21*a*, 21*b*, 21*c*. The trench 33 extends facing the active zone 14 and mainly in the direction of the length of this active zone 14 (the dimension measured parallel to the x axis of the reference frame [O; x; y; z]). Thus the trench 33 extends above the active zone 14 and mainly in a first direction parallel to the x axis on FIG. 4A.

Figure 4A:
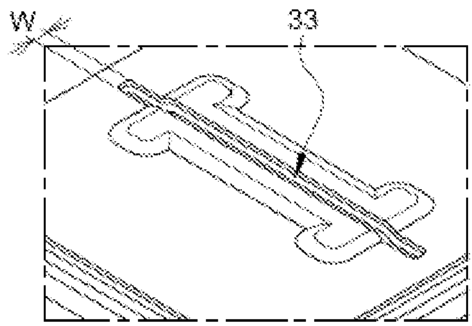
FIG. 4A is a perspective view of a trench formed through the masking layers.

In the particular example embodiment illustrated on FIG. 4A, the trench 33 may be extended facing a region of the substrate beyond the active zone 14 and wherein the surface semiconductor layer has been removed. The trench 33 is provided with a width W (the dimension measured parallel to the y axis of the reference frame [O; x; y; z], typically between 10 nm and 100 nm, for example of the order of 40 nm.

Figure 4B:
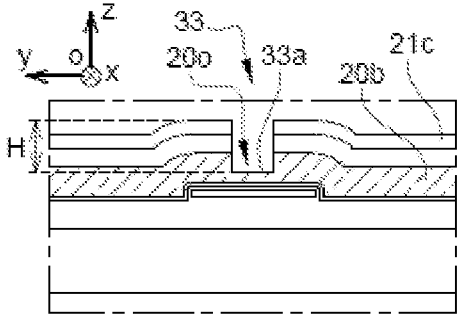
FIG. 4B is a view in cross section illustrating the trench.

The trench 33 includes a bottom 33*a* revealing the gate material. In the example embodiment illustrated on FIG. 4B, the trench 33 has the particularity of being extended in the direction of its height H (the dimension measured parallel to the z axis of the reference frame [O; x; y; z], FIG. 4B giving a view in cross section along a cutting plane passing through the axis B and orthogonal to the axis A indicated on FIG. 2) in a portion (a space referenced 20*o* on FIG. 4B, this portion having been removed) of the layer 20*b* of gate material. Producing the trench 33 thus includes, in this particular example embodiment, a partial etching of a portion of gate material and in particular here of a top portion of the layer 20*b* of polysilicon, a thickness of the gate material and in particular of the layer 20*b* of polysilicon being preserved at the end of the production of the trench 33.

Figure 5A:
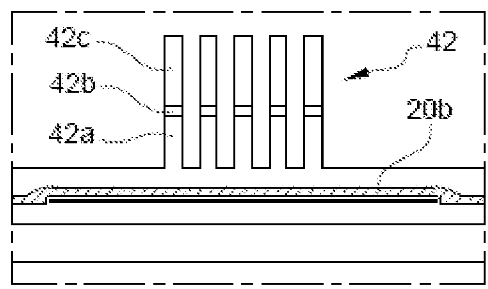
FIG. 5A is a view in cross section illustrating formation of a mask.
Figure 5B:
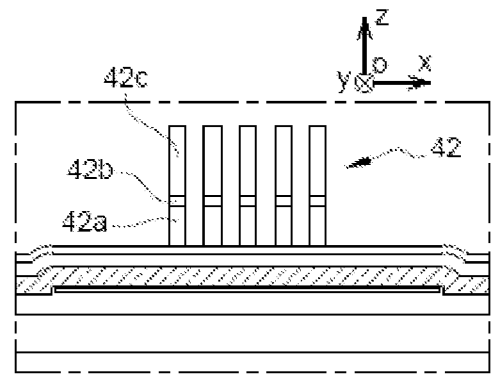
FIG. 5B is a view in cross section along a cutting plane orthogonal to the trench.

The mask 42 can be formed by a plurality of stacked layers. In the particular example embodiment illustrated, the mask 42 includes a triple layer, with a first layer 42*a* forming an organic hard mask, for example a layer of carbon deposited by centrifugation ("spin-on-carbon", also called SOC), surmounted by a non-reflecting second layer 42*b*, for example a non-reflecting layer made from silicon (SiARC), and by a third layer 42*c* that can be based on photosensitive resin. The mask 42 is typically formed by transferring a pattern defined first of all in the third layer 42*c* into the bottom layers 42*b* and 42*a*. In an advantageous embodiment as shown on FIG. 5A, the etching is stopped at the first layer 42*a*, as soon as the top layer 21*c* of the masking is reached. In this way a residue of the first layer 42*a* is left at the bottom of the previously formed trench 33 masking the layer 20*b* of gate material. This subsequently makes it possible to etch only the masking portions 21 revealed without causing over-etching of the trench 33. In the example embodiment illustrated, at the trench 33, the first hard mask layer 42*a* entirely covers the layer 20*b* of gate material and protects the latter.

Next one or more pairs of masking blocks in said one or more masking layers are defined by etching through the mask 42.

Once the etching has been implemented, the mask 42 is removed. For example, a plasma etching using an $O_2$ plasma can be used for removing the SOC layer. The layers of resin and SiARC are typically consumed during such etching.

The masking blocks 54, 55 formed typically extend in a direction orthogonal to that in which the active zone 14 mainly extends, in other words in the direction of the width (the dimension measured parallel to the y axis of the reference frame [O; x; y; z]) of the active zone 14. The masking blocks 54, 55 are, in this example, in the form of a parallelepipedal bar. The masking blocks 54, 55 formed thus extend mainly in a second direction parallel to the y axis and orthogonal to said first direction in which the trench extends.

Figure 6:
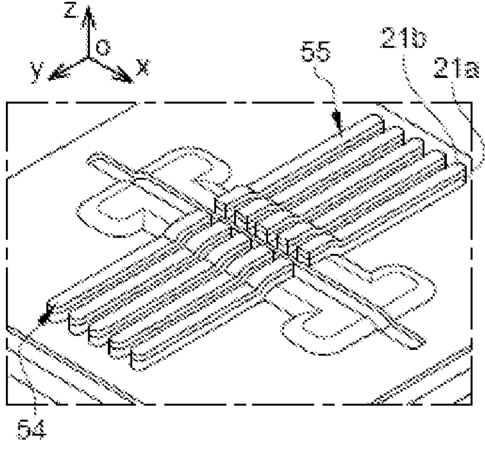
FIG. 6 illustrates forming a plurality of masking blocks.
Figure 7:
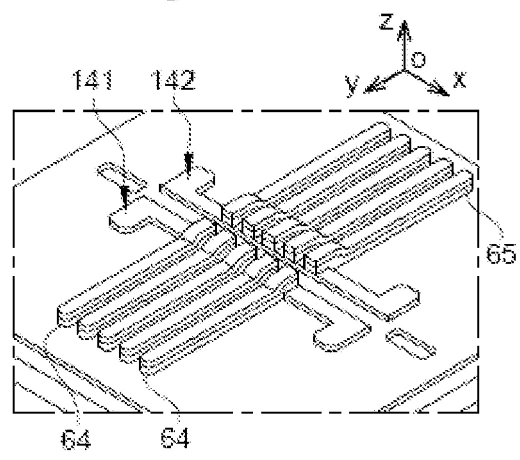
FIG. 7 illustrates forming a plurality of gate blocks.

A plurality of parallel pairs of masking blocks 54, 55 are typically formed. In the example embodiment illustrated on FIG. 6, each pair includes a first masking block 54 and a second masking block 55 facing the first masking block 54, the first masking block 54 and the second masking block 55 are disposed on either side of the trench 33, respectively on a first region of the active zone and on a second region of the active zone (the active zone being covered and not being referenced here on FIG. 6). The masking blocks 54, 55 are typically structured by means of one or more anisotropic etchings, for example by means of a plasma. The etching of the masking blocks, in particular the $SiO_2$ and SiN layers, is typically implemented by plasma dry etching methods of the fluorocarbon type. For example, $CF_4$ is used for etching the layer of $SiO_2$, and $CH_2F_2/SF_6$ for etching the layer of SiN. Next an etching of the gate stack is implemented, in other words of the layer or layers 20*a*, 20*b* of gate material and of the gate dielectric layer 19, so as to form each masking block 54, 55 or vertically in line with each masking block 54, 55 a gate block. In this way a plurality of pairs of gate blocks 64, 65 are produced. The gate blocks 64, 65 are typically formed by anisotropic etching for example using a plasma. At the trench 33, the etching leads to the removal of the gate material or materials and of the gate dielectric. Because a partial etching in the layer 20*b* of gate material produced previously in relation to FIG. 4B has been implemented, the etching can be extended more easily through the active zone 14 so as to reach the insulating layer 12. Each pair of blocks 64, 65 includes a first gate block 64 and a second gate block 65 facing the first gate block 64, the first gate block 64 and the second gate block 65 being disposed on either side of the trench 33, respectively on a first region 141 of the active zone and on a second region 142 of the separate active zone separated from the first region (FIG. 7) by a space at the bottom of the trench 33. The gate blocks 64, 65 are, in this example, a form of parallelepipedal bar. These bars typically extend in a direction orthogonal to that in which the separate regions 141, 142 of the active zone 14 mainly extend, in other words in the direction of their width (the dimension measured parallel to the y axis of the reference frame [O; x; y; z]). The pairs of gate blocks 64, 65 are preferably regularly spaced apart with a dense distribution, for example such that the distribution pitch of a pair of gate blocks is of the order of 100 nm. The gate blocks 64, 65 here extend mainly in the second direction orthogonal to said first direction or main direction of the trench 33.

The first region 141 can be the one in which the quantum boxes are intended to be formed while the second region 142 can be caused to form the charge detectors.

The fact that the trench 33 was produced before the step of defining the gate blocks 64, 65 helps to be able to dispose the latter precisely with respect to the active zone 14 and in particular with respect to edges 141*a*, 142*a* of the separate regions 141, 142 formed from this active zone 14. The fact that a partial removal of gate material 20*b* in the trench 33 was implemented previously leads, after formation of the masking blocks 54, 55, to having two distinct heights of gate material 20 to be etched. The etching implemented here makes it possible to consume, outside the trench 33, thicker areas of gate material 20*b* and to stop on the active zone 14, while in the trench 33 less thick areas of gate material 20*b* are consumed and the etching is extended into the active zone 14, in order to achieve separation of the latter. The etching of the active zone 14 and separation into two regions 141, 142 is thus done in a way that is autoaligned with the gate blocks 64, 65. A part of said active zone located in line with and facing the surface portion 200 removed previously is in its turn removed. Located in line with means here in particular a vertical alignment, in other words a zone located in a vertical projection. The two separate regions 141, 142 are distinct and spaced apart so that a passage of charges by tunnel effect in a zone between and separating these regions 141, 142 is here prevented.

In other words, the division of the active zone 14 into a first semiconductor region 141 and a second semiconductor region 142 makes it possible to eliminate tunnel coupling between these two regions 141, 142.

Figure 8A:
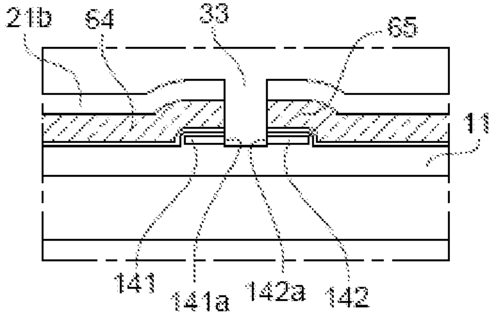
FIGS. 8A and 8B illustrate forming a masking layer on the gate blocks.
Figure 8B:
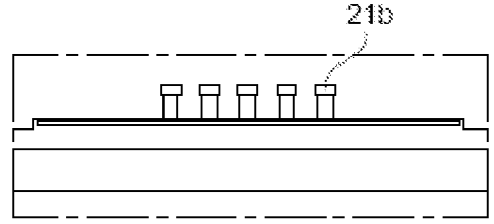

In the example embodiment illustrated on FIG. 8A, 8B, the pairs of gate blocks 64, 65 produced are still covered with the bottom masking layer 21*b* for example made from SiN, the top masking layer 21*c* having been removed during the etching of the layers 20*a,b* of gate material through the masking blocks 54, 55.

Figure 9:
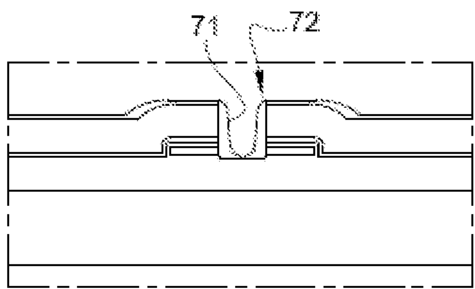
FIG. 9 illustrates forming insulating spacers between a pair of gate blocks.

Insulating spacers 72 can then be formed around each of the gate blocks 64, 65. The spacers 72 can be produced by depositing at least one insulating material 71. The deposition is implemented so as to fill in the intergate spaces, in particular between each pair of gates (FIG. 9) and between adjacent gates (FIG. 10) of separate pairs of gates. The insulating material or materials 71 of the spacers 72 is typically selected from one or more of the following materials: SiN, $SiO_2$, SiCO, SiBCN, SiOCN. The deposition method may be standard, and in particular of the ALD type (standing for "atomic layer deposition") in order to fill the spaces without creating any filling defect. According to a particular example embodiment, the insulating material 71 deposited has a thickness of the order of 30 nm.

Figure 10:
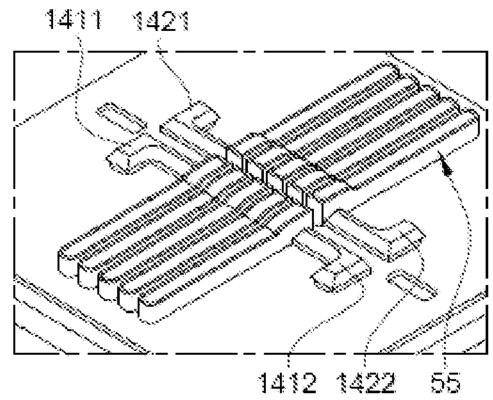
FIG. 10 illustrates partial removing of end portions of insulating material forming the spacers.

In the example embodiment illustrated on FIG. 10, next a partial removal of this insulating material 71 by etching is implemented so as to remove end portions 1411, 1412, and 1421, 1422 respectively of the first region 141, and of the second region 142 of the active zone 14.

Figure 11:
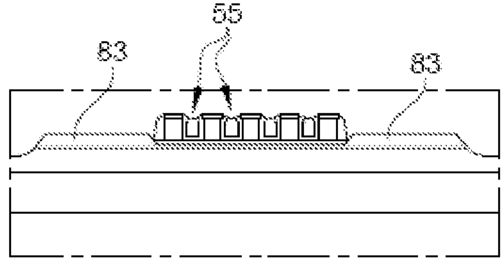
FIG. 11 illustrates growing semiconductor layers on the active zone.

To complete the formation of doping reservoirs on these portions 1411, 1412 and 1421, 1422 and to increase the thickness thereof, it is next possible to grow one or more layers of semiconductor material or materials 83 on these revealed portions 1411, 1412 and 1421, 1422 of the active zone (FIG. 11).

This can be done by epitaxial growth of silicon or by means of a CVD deposition (standing for "chemical vapour deposition") for example of germanium. A doping can then be implemented by ion implantation or by in situ doping implemented concomitantly with the growth of the layer or layers of semiconductor material or materials 83, for example to form Si:P (phosphorus-doped silicon) or SiGe:B (boron-doped silicon germanium).

Figure 12:
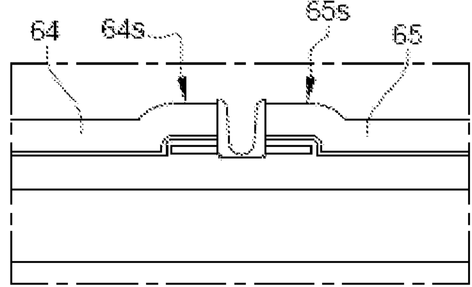
FIG. 12 is a view in cross section illustrating removal of the masking blocks.
Figure 13:
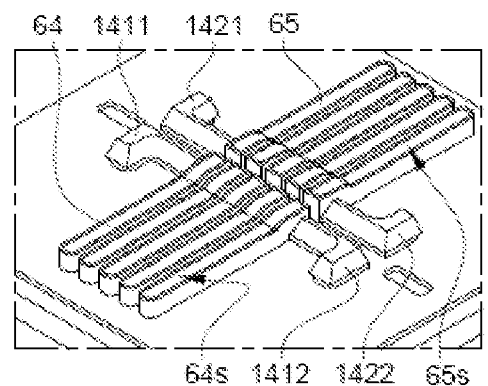
FIG. 13 is a perspective view illustrating removal of the masking layers.

In order to reduce the contact resistance of the dopant reservoirs and/or of the gate blocks 64, 65 when at least a part of these blocks is produced from doped semiconductor material, it is next possible to form zones based on metal material on these reservoirs and/or gate blocks. For this purpose, the remainder of the masking blocks (FIGS. 12 and 13) arranged on the gate blocks 64, 65 is removed so as to reveal the top face 64*s*, 65*s* of the latter. Such a removal can be implemented by means of a selective chemical etching method. For example an etching using $H_3PO_4$ at a temperature of the order of 100° C. and for a period of one hour can be implemented when it is wished to remove the masking layer 21*b* of SiN. The duration of the etching can be of the order of 30 min, for a layer of SiN of the order of 20 nm deposited by PECVD.

It is then possible to form metal and semiconductor alloy zones. Such zones are formed respectively on a top face 64*s*, 65*s* of the gate blocks 64, 65 as well as on a top face of the dopant reservoirs 1411, 1412, 1421, 1422. For this purpose, a siliciding method comprising a step of depositing at least one layer of metal, such as for example Ni, Pt, W, Co, Ti, or V can be implemented. The layer of metal may optionally be covered with an encapsulation layer that may be metallic. An example of encapsulation is formed by a deposit of TiN, with a thickness for example of the order of 10 nm. Heat treatment is carried out for implementing the siliciding. Such treatment may be implemented at a temperature of between 200° C. and 900° C. and a duration adapted according to the treatment temperature. A removal of metal that has not reacted can next be implemented, for example by wet etching using a solution of the SPM type (standing for "sulfuric peroxide mix") hot. A second siliciding annealing can also be implemented.

A variant of a method for producing a quantum device will now be described in relation to FIGS. 14 to 19.

A sequence of steps as described previously in relation to FIGS. 1 to 4 can first of all be followed, in order to define an active zone, a gate stack covering in particular this active zone and masking layers on this stack.

Then (FIG. 14A), a trench 233 is formed through one or more masking layers, this trench this time extending entirely facing the active zone 14 and does not go beyond this zone 14. Such a trench 233 is produced typically by anisotropic etching in particular using a plasma. For example, a plasma dry etching can be employed to etch the $SiO_2$ and SiN layers typically by means of a fluorocarbon compound. For example, $CF_4$ is used for etching the $SiO_2$, while $CH_2F_2/SF_6$ can be employed for etching the layer of SiN.

Figure 14A:
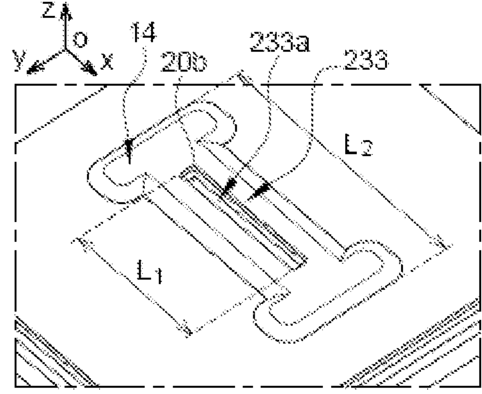
FIG. 14A illustrates a variant of the method of forming a quantum device according to the first embodiment of the invention.
Figure 14B:
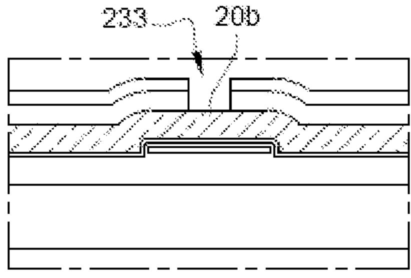
FIG. 14B is a view in cross section illustrating forming a trench.
Figure 15A:
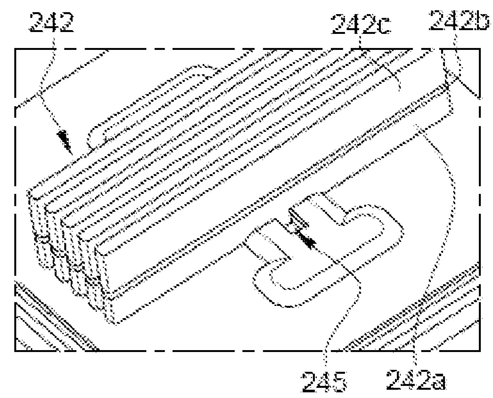
FIGS. 15A and 15B illustrate forming masking elements.
Figure 15B:
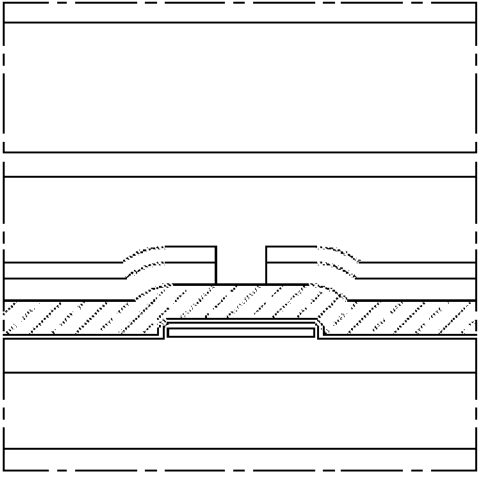

The trench 233 thus extends along a length $L_2$ greater than a length $L_1$ (dimensions measured parallel to the x axis of the reference frame [O; x; y; z]) of the active zone 14. The trench 233 thus formed includes a bottom 233*a* revealing a layer 20*b* of gate material. In this example embodiment (and unlike the method described previously in relation to FIG. 4B where the trench was extended into the layer 20*b* of gate material) here the trench 233 is formed while stopping at the gate material surface, preferably without etching the latter (FIG. 14B).

Next a mask formed by a plurality of separate masking elements 242 is produced (FIGS. 15A and 15B), here oblong in shape and which may in particular be parallelepipedal. Each masking element 242 may, there also, be formed for example from an organic hard mask 242*a*, for example of the SOC type, surmounted by a non-reflecting layer 242*b*, for example of the SiARC type, and by a layer 242*c* of photosensitive resin.

The masking elements 242 are transverse with respect to the trench 233. These masking elements 242 are thus typically parallel to each other and oriented orthogonally to the trench 233. In this example, the masking elements 242 have the particularity of being separate from each other, so that, at the bottom of the trench 233, zones 245 of the layer 20*b* of gate material are revealed and are thus not protected.

Figures 16, 17:
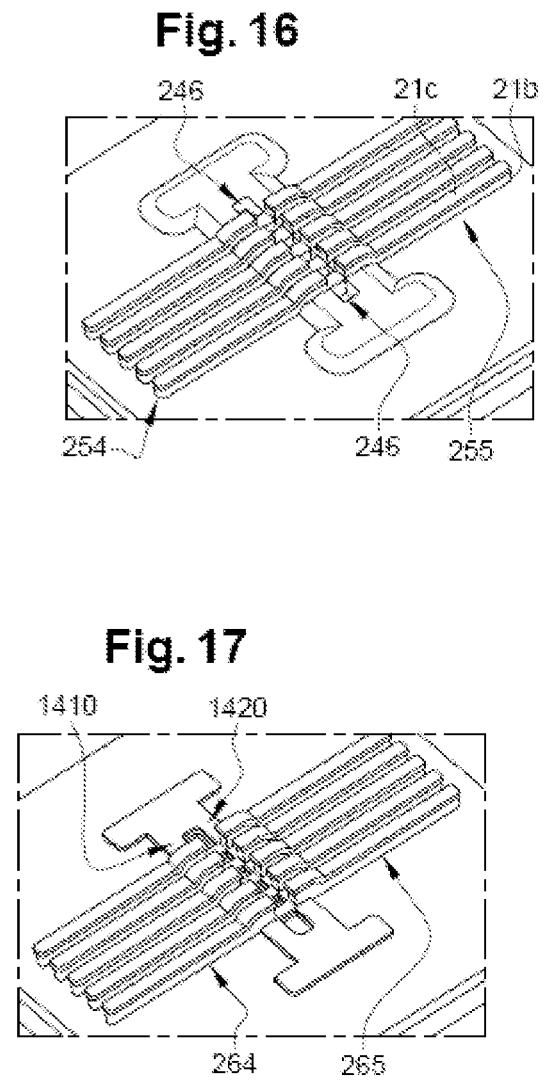

Then an anisotropic etching of parts of the masking layers 21*b*, 21*c* not protected by the transverse masking elements 242 is implemented. In this way the masking blocks 254, 255 are formed (FIG. 16). During this anisotropic etching the revealed portions 245 of gate material, not covered by the masking elements 242, are partially etched at the bottom of the trench 233, so as to form holes 246 in the layer of gate material.

Next the masking elements are removed. Then an anisotropic etching of the layer or layers of gate material is implemented so as to form gate blocks 264, 265 reproducing the patterns of the masking blocks 254, 255 (FIG. 17). Such etching is typically implemented by means of a plasma. For example, a plasma anisotropic etching method using HBr can be used for etching polysilicon, while an $SiCl_2/Cl_4$ etching is employed for etching TiN. The partial etching of the layer 20*b* of gate material previously implemented is then extended so as to divide the active zone 14 into a first semiconductor region 1410 and a second semiconductor region 1420. The holes 246 formed previously in the layer 20*b* of gate material are here reproduced in the active zone 14. In this way, at the bottom of the trench 233, parts of said active zone 14 located in line with the portions 246 of the layer of gate material that have not been protected by the masking elements 242 are removed.

Figure 18:
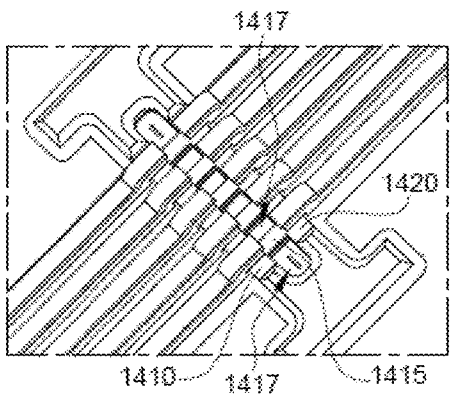
FIG. 18 illustrates forming holes in the semiconductor region.

In this way, as illustrated on FIG. 18, holes 1417 are formed between the first semiconductor region 140 and the second semiconductor region 1420, the first semiconductor region 1410 and the second semiconductor region 1420 being connected together by semiconductor portions 1415 coming from the active zone 14 and arranged between these holes 1415.

Figure 19:
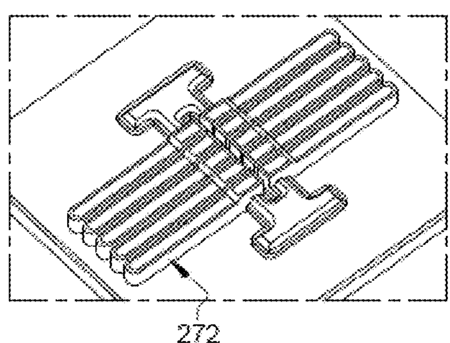
FIG. 19 illustrates forming insulating spacers.
Figure 20:
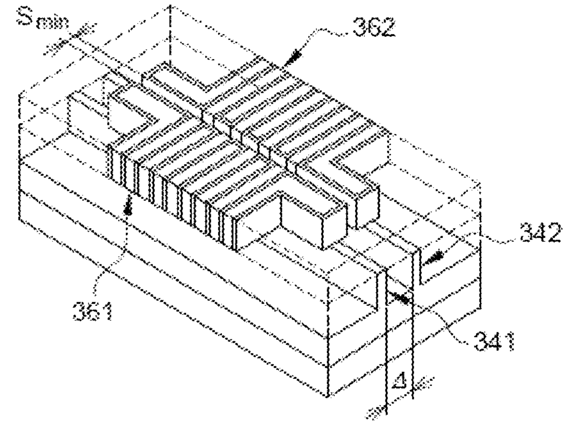
FIG. 20 serves to illustrate a structure of a quantum device as implemented according to the prior art.

As in the example of a method described previously, insulating spacers 272 can next be formed around the gate blocks 264, 265 (FIG. 19). Other steps such as the formation of reservoirs of dopant and then the siliciding of the reservoirs and of revealed portions of gate blocks can also be implemented, for example in a manner as described previously in relation to the first embodiment.

The structure here formed in this second embodiment makes it possible to obtain a direct coupling by tunnel effect between the quantum boxes formed in the first semiconductor region and the quantum boxes used for the detection formed in the second semiconductor region. This makes it possible to envisage the establishment of spin reading protocols in parallel by gate reflectometry. It can thus make it possible to implement a detection mode distinct from that of the structure the production of which was described previously in relation to FIGS. 1 to 13.

A first row of quantum boxes can then be used for storing/manipulating the quantum information whereas a second row of quantum boxes can be used for charge and spin detection.

For this structure as for the previous one, the number of gate blocks is not limited to the one illustrated. The structure the manufacture of which has been described in relation to FIGS. 15-19 may include a matrix of 2×N aligned quantum boxes (with N≥1).

The invention claimed is:

1. A method for fabricating a quantum device, the method comprising:

forming, on an active zone of semiconductor material resting on a substrate, a stack comprising at least one layer of gate material and one or more masking layers on the at least one layer of gate material, forming, above the active zone, a trench by etching through the one or more masking layers, the trench extending in a first direction parallel to a plane of the substrate, forming, in the one or more masking layers of the stack, one or more pairs of masking blocks, each pair of masking blocks including a first masking block and a second masking block facing the first masking block, the first masking block and the second masking block being disposed facing each other and on either side of the trench, the first masking block and the second masking block extending in a second direction, the second direction being parallel to the plane of the substrate and being orthogonal to the first direction, etching the at least one layer of gate material so as to form a gate block vertically in line with each pair of masking blocks, the gate block extending in the second direction, and removing, at a bottom of the trench, the semiconductor material of the active zone located vertically in line with one or more removed surface portions of the at least one layer of gate material so as to divide the active zone into a first semiconductor region and a second semiconductor region that is entirely separate from the first semiconductor region.

2. The method according to claim 1, further comprising, after etching through the one or more masking layers and prior to the forming of the one or more pairs of masking blocks, extending the trench vertically so as to remove one or more surface portions of the at least one layer of gate material.

3. The method according to claim 1, wherein the trench extends in the first direction beyond the active zone.

4. The method according to claim 1, wherein the step of forming the one or more pairs of masking blocks is performed after the removal at the bottom of the trench of said one or more surface portions, forming the masking blocks comprises:

forming one or more masking elements transverse with respect to the trench, the transverse masking elements covering the trench, the masking elements being formed by depositing and structuring at least one hard mask layer, the hard mask layer being preserved in the trench, anisotropic etching of zones of the one or more masking layers not protected by the transverse masking elements, and removing the masking elements.

5. The method according to claim 1, wherein the trench is produced by etching the one or more masking layers while stopping on the at least one layer of gate material, the method further comprises, after producing the trench, forming one or more masking elements traversing the trench, the one or more masking elements being transverse with respect to the trench and being separate from each other, removing the one or more surface portions of the at least one layer of gate material in line with the trench, and forming the one or more pairs of masking blocks comprising anisotropically etching zones not protected by the one or more masking elements, and the method further comprises, prior to the etching of the at least one layer of gate material so as to form a gate block, removing the one or more masking elements.

6. The method according to claim 5, wherein the trench extends entirely facing the active zone.

7. The method according to claim 1, further comprising, after forming the gate block, forming insulating spacers around the gate block, a region of the spacers extending in the trench.

8. The method according to claim 1, further comprising, after forming the gate block, growing doped semiconductor material on regions of the active zone disposed on either side of the gate block, so as to form reservoirs of dopants.

9. The method according to claim 8, further comprising, after forming the reservoirs of dopants, siliciding a top face of the reservoirs of dopants and the gate block.

10. The method according to claim 1, wherein the active zone is formed by a pattern in a surface layer of a substrate of the semiconductor on insulator type provided with a semiconductor support layer and with an insulating layer, the insulating layer being arranged between the support layer and said surface layer.

11. The method according to claim 1, wherein the removing the bottom of the trench of the at least a part of the active zone comprises etching the active zone over an entire thickness thereof.

12. The method according to claim 1, wherein after forming the one or more pairs of masking blocks, the first masking block and the second masking block facing the first masking block are discontinuous across the trench.

13. A method for fabricating a quantum device, comprising:

forming, on a semiconductor active zone resting on a substrate, a stack comprising a gate dielectric layer, at least one layer of gate material and one or more masking layers on the at least one layer of gate material, forming, above the semiconductor active zone, a trench by etching through the one or more masking layers, the trench extending in a first direction, the first direction being parallel to a plane of the substrate, the trench etching being stopped on the at least one layer of gate material, forming one or more masking elements traversing the trench, the one or more masking elements being transverse with respect to the trench and being separate from each other, the one or more masking elements extending in a second direction, the second direction being parallel to the plane of the substrate and being orthogonal to the first direction, anisotropically etching parts of the one or more masking layers not protected by the one or more masking elements, whereas regions of the one or more masking layers protected by the one or more masking elements remain unetched and form a masking block, removing the one or more masking elements, anisotropically etching the at least one layer of gate material so as to form a gate block vertically in line with each masking block, the gate block extending in the second direction, and etching the semiconductor active zone.

14. The method according to claim 13, wherein the etching of the active zone comprises anisotropic etching conducted so as to divide the semiconductor active zone into a first semiconductor region and a second semiconductor region, the first semiconductor region and the second semiconductor region being connected together by semiconductor portions.

15. The method according to claim 13, wherein the semiconductor active zone is longer than the trench in the first direction, the trench being entirely located opposite of the semiconductor active zone.

16. The method according to claim 13, further comprising:

after forming the gate block, forming insulating spacers around the gate block, a region of the spacers extending in the trench, and growing doped semiconductor material on regions of the active zone disposed on either side of the gate block, so as to form reservoirs of dopants.

17. The method according to claim 13, wherein the active zone is formed by a pattern in a surface layer of a substrate of the semiconductor on insulator type provided with a semiconductor support layer and with an insulating layer, the insulating layer being arranged between the support layer and said surface layer.

18. A method for fabricating a quantum device, the method comprising:

forming, on an active zone of semiconductor material resting on a substrate, a stack comprising at least one layer of gate material and one or more masking layers on the at least one layer of gate material, forming, above the active zone, a trench by etching through the one or more masking layers, the trench extending in a first direction parallel to a plane of the substrate, forming, in the one or more masking layers of the stack, one or more pairs of masking blocks, each pair of masking blocks including a first masking block and a second masking block facing the first masking block, the first masking block and the second masking block being disposed facing each other and on either side of the trench, the first masking block and the second masking block extending in a second direction, the second direction being parallel to the plane of the substrate and being orthogonal to the first direction, etching the at least one layer of gate material so as to form a gate block vertically in line with each pair of masking blocks, the gate block extending in the second direction, and removing, at a bottom of the trench, at least a part of the active zone located vertically in line with one or more removed surface portions of the at least one layer of gate material, wherein the removing the bottom of the trench of the at least a part of the active zone comprises etching the active zone over an entire thickness thereof.

* * * * *